US005868300A

United States Patent [19]
Babayan

[11] Patent Number: 5,868,300
[45] Date of Patent: Feb. 9, 1999

[54] ARTICULATED WIRE BONDER

[75] Inventor: Vartan Babayan, Huntington Beach, Calif.

[73] Assignee: Orthodyne Electronics Corporation, Irvine, Calif.

[21] Appl. No.: 615,470

[22] Filed: Mar. 14, 1996

Related U.S. Application Data

[60] Provisional application No. 60/000,704 Jun. 29, 1995.

[51] Int. Cl.[6] .................................................. H01L 21/607
[52] U.S. Cl. .......................... 228/180.5; 228/1.1; 228/102
[58] Field of Search .......................... 228/1.1, 102, 180.5

[56] References Cited

U.S. PATENT DOCUMENTS

| | | |
|---|---|---|
| 3,302,277 | 2/1967 | Pruden et al. . |
| 3,460,238 | 8/1969 | Christy et al. . |
| 3,784,079 | 1/1974 | Spanjer . |
| 3,794,236 | 2/1974 | Salzer et al. . |
| 4,202,482 | 5/1980 | Sade et al. ........................... 228/1.1 X |
| 4,239,144 | 12/1980 | Elles et al. . |
| 4,341,574 | 7/1982 | Landes . |
| 4,409,659 | 10/1983 | Devine . |
| 4,418,858 | 12/1983 | Miller . |
| 4,438,880 | 3/1984 | Smith et al. . |
| 4,550,871 | 11/1985 | Chan et al. . |
| 4,571,688 | 2/1986 | Kashihara . |
| 4,597,519 | 7/1986 | Kurtz et al. . |
| 4,603,802 | 8/1986 | Kurtz et al. . |
| 4,606,490 | 8/1986 | Chan et al. . |
| 4,619,397 | 10/1986 | Urban . |
| 4,696,425 | 9/1987 | Landes . |
| 4,771,930 | 9/1988 | Giletti et al. .......................... 228/1.1 X |
| 4,789,095 | 12/1988 | Kobayashi . |
| 4,854,494 | 8/1989 | von Raben .......................... 228/1.1 X |
| 4,976,392 | 12/1990 | Smith et al. ......................... 228/1.1 X |

FOREIGN PATENT DOCUMENTS

| | | |
|---|---|---|
| 57-91533 A | 6/1982 | Japan . |
| 62-219533 A | 9/1987 | Japan . |
| 493317 | 1/1973 | Russian Federation . |
| 462682 | 2/1973 | Russian Federation . |

OTHER PUBLICATIONS

IBM Technical Disclosure Bulletin Entitled Cutting Fine Lead Wires After Ultrasonic Bonding —By B. w. Miller —vol. 10 No. 3 Aug. 1967.
IBM Technical Disclosure Bulletin Entitled Ultrasonic Bonding Tip —By V.T. Ho and S.E. Nichols, Jr. —vol. 10 No. 12 May 1968.

Primary Examiner—Kenneth J. Ramsey
Attorney, Agent, or Firm—George F. Bethel; Patience K. Bethel

[57] ABSTRACT

A wire bonding head supported for movement upwardly and downwardly having a wire bonding tool connected to an ultrasonic driver in order to sonically bond a wire to an underlying electrical component. The wire is fed to the bonding tool, and fed broken and clamped by a linkage connected to at least one stepper motor. A processing unit is mounted on the bonding head for controlling the clamping, feeding, and breaking of the wire.

30 Claims, 9 Drawing Sheets

ARTICULATED WIRE BONDER

This application claims the benefit of U.S. Provisional Application Number 60/000,704 as filed Jun. 29, 1995.

BACKGROUND OF THE INVENTION

1. Field of the Invention

The field of this invention lies within the ultrasonic bonding art. It particularly resides within the scope and field wherein wires are bonded to semiconductors. It is known to bond such wires to semiconductors in order to provide leads from semiconductors to certain terminals and other areas.

2. Background of the Invention and Prior Art

Wedge bonding for semiconductors is known in the art as a practical and expedient method to bond wires to semiconductors. Such bonding employs machinery and methods with a wire oftentimes formed of aluminum. The aluminum wire is connected from one point to another by the bonding. The diameter of such wire in many cases can range from between 0.001 to 0.025 inches.

To initiate a bond, the wire is pressed against a semiconductor chip or integrated circuit with a bonding tool. The end of the tool is vibrated with an ultrasonic vibration in a plane of motion generally parallel to the surface of the semiconductor chip to which a wire bond is to be formed. This ultrasonic vibration is for a period of tens of milliseconds.

The combination of a static load on the bonding tool normal to the chip's surface to which the wire is bonded and the vibration at the end of the tool parallel to the surface causes the wire to plastically deform. As the wire plastically deforms, it simultaneously joins with the atoms of the material composing the chip's surface to provide a cold weld.

One of the most difficult problems associated with wire bonding is the manipulation and clamping of the wire and the severing of it after a bond. To perform these functions most fine wire wedge bonders, present and past, have used conventional actuators such as solenoids or voice coils that feed and break the wire, and/or open and close wire clamps.

Such conventional actuators which are driven by solenoids or voice coils have an attendant problem with respect to longevity and their electro-mechanical functions. As can be appreciated, with a solenoid, the moving parts of the solenoid cause friction, and respective interference and wear points. Also, solenoids do not operate as smoothly as other devices.

Another problem with solenoids is that they can not be programmed by a computer. This particular invention has enabled the state of the art of wire bonding to be substantially computerized as to movement and control of the actuation of the movement of the wire and/or the opening and closing of the wire clamps for holding the wire.

The bond head of this invention does not require physical adjustment. It is fundamentally software driven and controlled. The features of the invention are enhanced as to both control and inputs.

In order to effectuate the control, a menu or series of commands can be generated at a keyboard or other input means. This provides not only adjustment, but control of the bond head. The overall adjustment is created in a manner whereby the input to the control means and the mechanical moving means is substantially enhanced. The mechanical movement or drive functions of the invention comprises stepper motors. The control of the stepper motors is with an onboard computer on the bond head.

Figure 3:
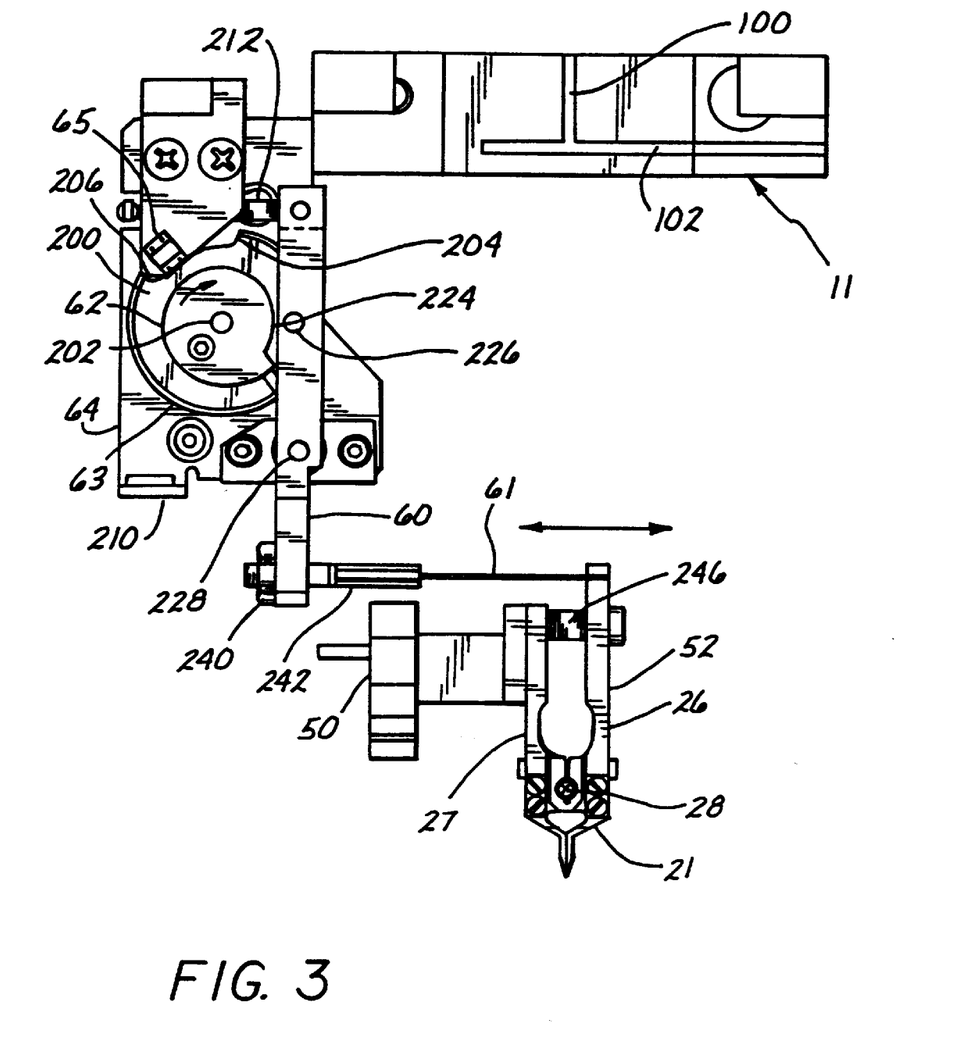
FIG. 3 shows an enlarged side elevation view.
Figure 4:
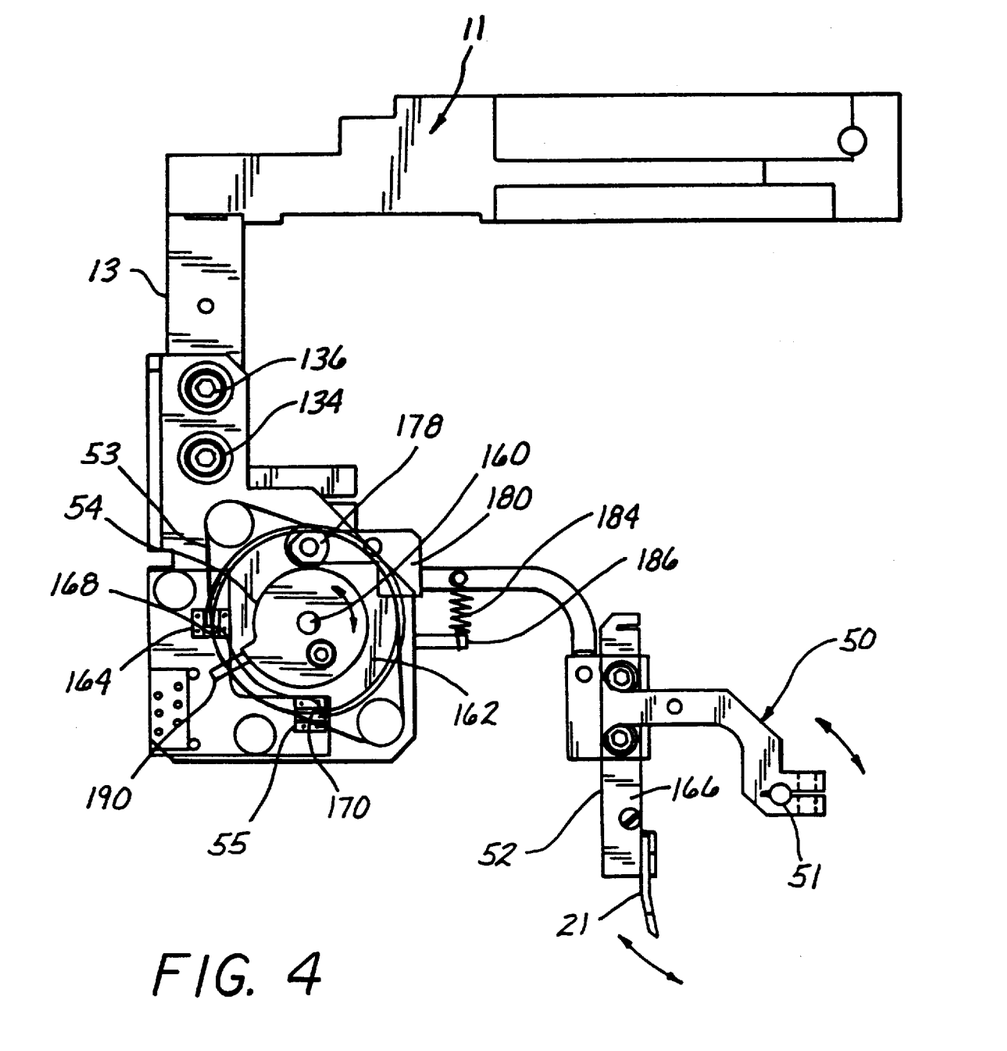
FIG. 4 shows a view with a portion of the parts removed as seen within the interior segment of FIG. 1.

In the bond head of this invention, 2 miniature stepper motors are used for actuating a wire clamp. One opens and closes the clamp as shown in FIG. 4. The other moves it forwardly or backwardly to feed wire for a first bond and a breaking of the wire after a second bond has been made as shown in FIG. 3. Both stepper motors use cams for smooth motion. The miniature stepper motors in the bond head are computer controlled and require no manual adjustment. The wire clamp opening is taught by the operator using the control panel.

The wire feed and wire break or severance are each programmable. The operator can also increase or decrease the tail length of the first bond by simply changing the number in a wire parameter screen. The same is true for providing a break or severance distance. Each motor has dedicated sensors for providing a home position and direction verification. They are both controlled by a local microcontroller (see FIG. 7). This microcontroller communicates with the main CPU in the bonder via the serial peripheral interface (SPI) provided with the microcontroller chip (see FIG. 6).

SUMMARY OF THE INVENTION

In summation, this invention comprises a fine wire bonder, such as a 2 mil wire bonder with a precise wire control mechanism as shown in FIGS. 3 and 4. The bond head uses no adjustment screws or any other cumbersome methods for controlling tail length. The adjustments are computer controlled, and the movement is enhanced by the positioning and mounting of the stepper motors and controls on the head of the bonder proximate the work.

More particularly, the bond head of this invention has a means for attaching it to the movement of a mechanical ground tube. The tube moves in the various directions that are necessary to control the head on a macro basis. The head incorporates a first stepper motor which provides movement to a wire clamp assembly. The stepper motor controls a cam which has a cam follower in proximate relationship thereto. As the cam moves, it controls the opening and closing of the wire clamp assembly. This movement in turn is controlled and driven through a computer which is on the bond head and controlled by a host computer.

The feed and the breaking of the wire is controlled by a second stepper motor which moves the wire and causes it to be fed as well as moved with respect to the work. This is based upon the second stepper motor which is also computer controlled and pivotally orientated so as to move the wire in a feeding manner and breaking manner. These particular positions can be seen more readily in the figures which follow and in particular as to the wire orientation shown in FIGS. 8 through 16.

The entire input and output as well as controls are provided by an operator having the ability to store the specific functions of the bond head in a computer and then cause the bond head to move according to the respective commands based upon the input of the operator. Thus, the wire clamping, the wire feed and breaking of the wire as well as other functions are all computer controlled and driven with stepper motors without the need of various electro-mechanical elements such as solenoids or other linearly driven electro-mechanical systems.

DESCRIPTION OF THE PREFERRED EMBODIMENTS

Figure 1:
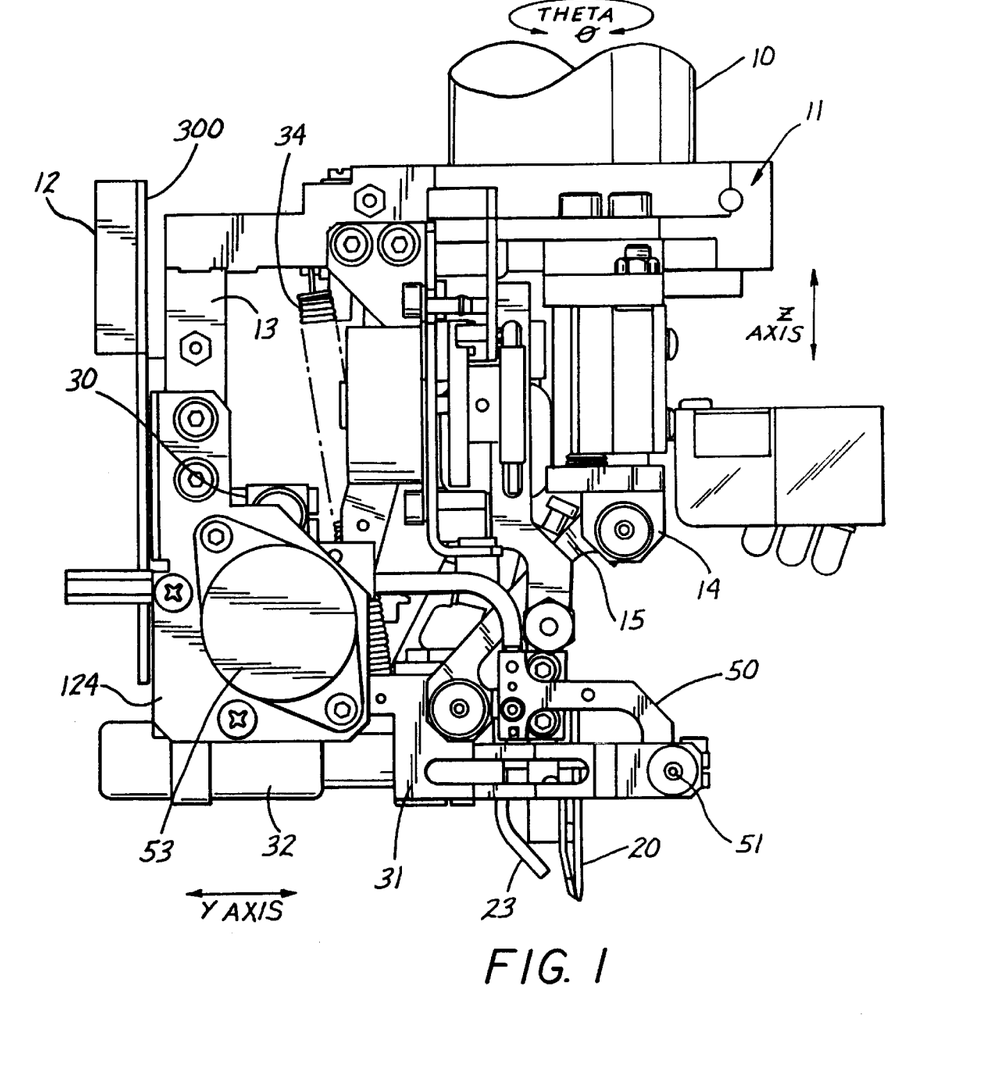
FIG. 1 shows a side elevation view of the bond head of this invention.
Figure 2:
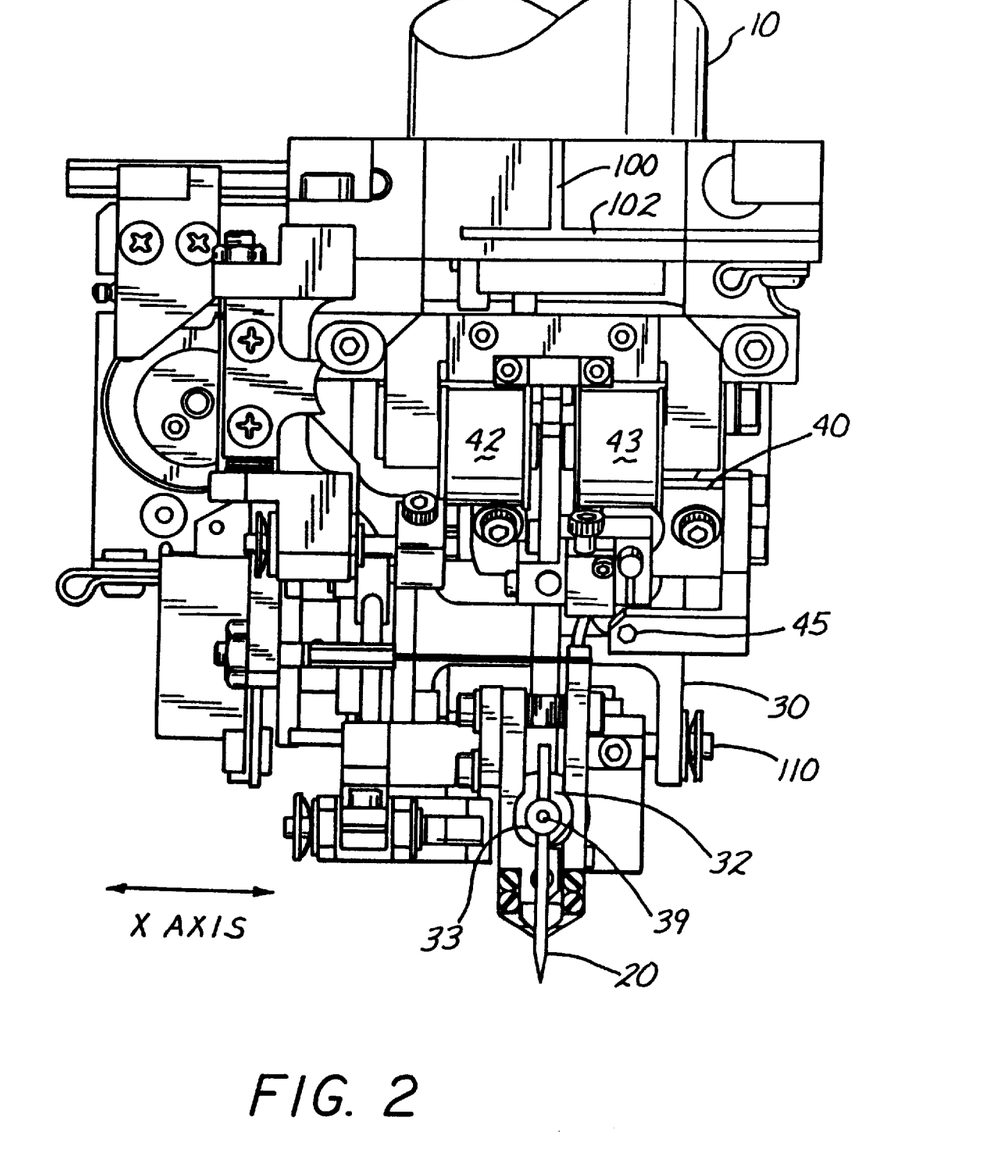
FIG. 2 shows a frontal elevation view of the bond head of this invention.

FIGS. 1 and 2 show side and front elevation views of the apparatus of this invention in the form of the bonding head attached to a cylindrical or rotary bearing tube 10. The entire tube or cylinder 10 is supported by a combined linear rotary bearing system not shown in FIGS. 1 and 2 because it is hidden by the internal support structure. The bearing system in turn is attached to an X-Y platform or structure. This allows the head to move in X, Y, Z and theta (rotational) axes. All movements are computer controlled and programmable. Please note the controls and movement as specified in U.S. Pat. No. 4,976,392 as to the movement of the head and in particular the tube 10.

Attached to the rotary bearing tube 10 is a block, clamp or support member 11. The block 11 is secured to the tube 10 by having a split 100 and 102 at any portion thereof tightened around the tube 10. Tightening is accomplished by a screw so that the member 11 can be tightened around the circumference of the bearing tube 10.

Attached to and forming a portion of the clamp or support member or block 11 is a rear upright bracket or stanchion 13. This bracket or stanchion 13 supports an H link 30 which in turn supports a transducer holder block 31 as seen more clearly in FIG. 5. The H link 30 is part of a linkage to keep the bonding tool in proper alignment. It should be noted that the H link has four pivot points at the four ends of the H that allow pivotal guided movement at the top and bottom of the H link.

Figure 5:
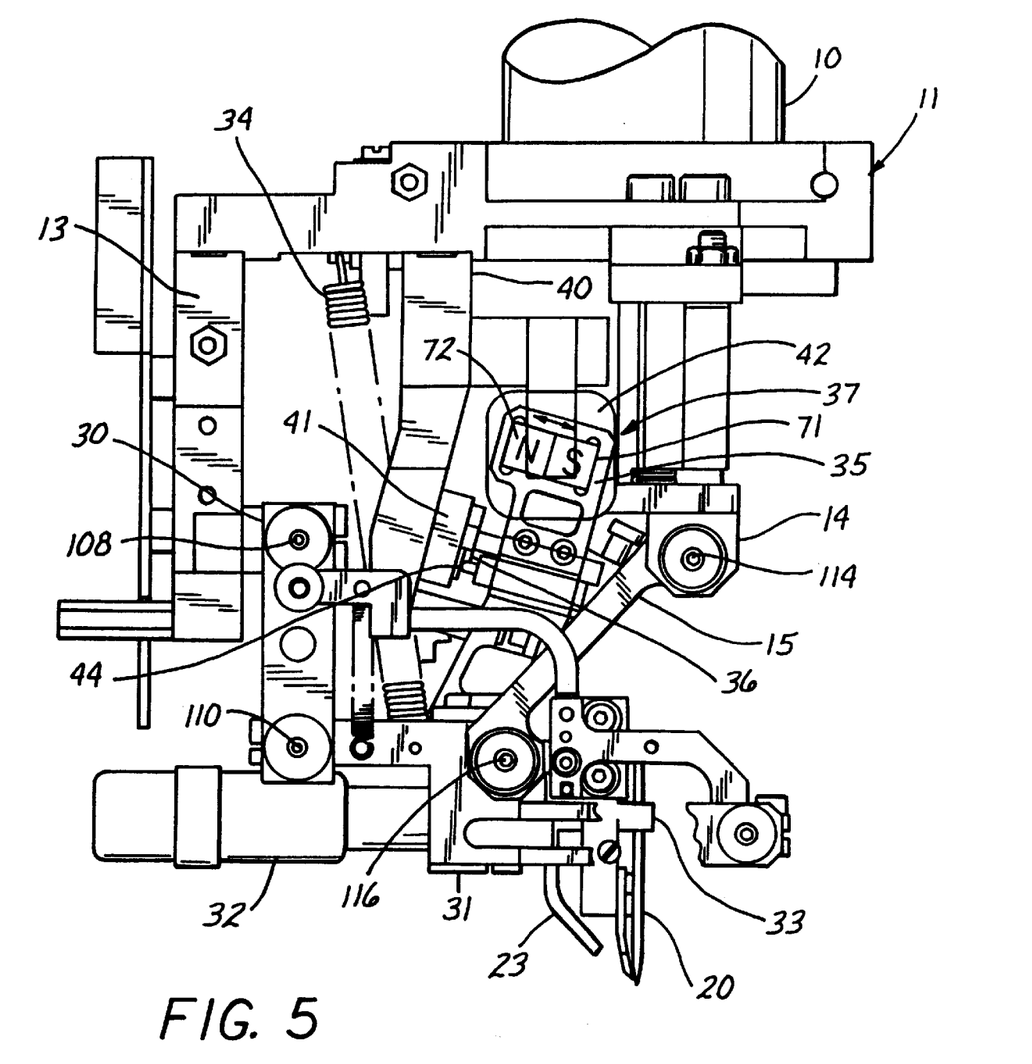
FIG. 5 shows an enlarged view of the components of FIG. 1 with a bracket removed for exposure of the parts for greater understanding.

Attached to and depending from a portion of the clamp support 11 is a front bracket 14 that supports a front link 15. The bracket 14 is bolted to the support member 11 and forms a solid extension for support of the linkages connected to the transducer as set forth hereinafter.

The front link 15 also supports the transducer holder block 31. The H link 30 and front link 15 together form a virtual pivot that enables the tip of a bonding tool 20 to travel vertically when the transducer holder block 31 is pivoted from search height down to the work to which a bond is to be made.

The pivot point of the virtual pivot is formed as an extension from the axes 108/110, and 114/116 which link the H link 30, front link 15 and transducer support block 31 together. The pivot points 108 and 110 allow the H link 30 to move backwardly and forwardly in an arc around the axis of pivot point 108. As the H link 30 moves backwardly and forwardly around the pivot point 108, it causes the transducer support or holder block 31 to swing as it is supported on pivot points 114 and 116.

In effect the virtual pivot is at a point defined by the intersection of a line through the axes 108 and 110 intersecting with a line through the axes 114 and 116. The virtual pivot is thus below the orientation of the showing of FIG. 5 at the intersecting point defined by the extensions of the two lines extending from the foregoing axes.

The front link 15 swings around the axis of pivot 114. This movement causes the transducer support 31 to swing in a manner to provide a virtual pivot so that a movement can be created that is preferable for moving the bonding head 20. Theoretically, when a line passing through pivot points 108 and 110 intersect a line passing through the pivot points 114 and 116, they intersect at a point analogous to the movement point of the end of the bonding tool. This causes the transducer holder block 31 to swing through an arc to create a virtual pivot.

It should be understood that the pivots 108, 110, 114 and 116 are in the form of bearing surfaces which can be of any suitable type to allow for pivoting around the axes thereof. Also, the relationship of the H link or block 30 is shown in greater detail in FIG. 2 from the standpoint of the frontal elevation view thereof showing it in an H block configuration as supported at its lower point supporting the transducer holding block 31 at a bearing surface and pivot point 110.

For clarification purposes it should also be understood that a mounting block or cover 124 of FIG. 1 covers up the pivot 110 and the details of the transducer which shall be described hereinafter. Mounting cover 124 is secured by screws, bolts or other means. These serve to hold the mounting block or cover 124 which serves to support and the cover a stepper motor which controls the movement as hereinafter described and detailed in FIG. 4.

Attached to the transducer holder block 31 is a transducer 32. The transducer 32 is connected to a current source in order to provide for oscillatory driving movement or ultrasonic bonding energy. The oscillatory movement is delivered in the direction of the Y axis as seen in FIG. 1. This serves to propagate a wave through an ultrasonic horn generally shown as horn 33. The ultrasonic horn 33 comprises three respective portions which are known in the art and used for ultrasonic bonding such as in U.S. Pat. No. 4,976,392. The tool 20 is attached to the horn 33 by set screw 39.

The ultrasonic vibrations providing the bonding energy are provided by electrical energy delivered to the transducer to provide pulses and driving in an ultrasonic manner of the horn 33 attached thereto. The waves are propagated in the Y axis so that the waves meet at a node within the transducer holder block 31. The holder block 31 fundamentally forms a point of nodal support so that the waves can propagate and meet at a node in the holder block 31. The propagation of the waves down the horn 33 allows for the bonding tool 20 to be vibrated in a manner so that it moves at its end portion in a plane roughly parallel to which a wire is to be ultrasonically bonded.

The transducer holder block 31 is spring loaded upwardly against an adjustable stop 44 by a spring 34. An upward force of 100 grams is applied by the spring 34. An adjustment screw is used for setting the spring tension.

Attached to transducer block 31 is a magnet holder 35 formed of one piece of metal or plastic that holds a pair of magnets 71 and 72 that are situated in a magnetic field created by a pair of magnetic coils 42 and 43. The direction of the force is dependent upon the current direction in the coils 42 and 43.

The coils 42 and 43 and the magnet holder 35 together create a bi-directional linear motor 37. The linear motor 37 not only moves the transducer holder block 31 in both directions, but can also control the force applied on a wire 24 to be bonded under the tool 20. This is shown in FIGS. 8 through 16 when ultrasonic energy is applied. The current applied to the linear motor 37 is computer controlled and programmable by the host computer. The range is ±250 grams which can provide maximum net force of 150 grams on the wire 24 by tool 20. The resolution for applying the force change is one gram per bit as to the host computer input and related programs.

The magnet holder 35 also is connected to a core, see FIG. 5 of a position sensor 36 formed from a linear voltage differential transformer (LVDT). The LVDT constitutes a core which moves in and out of a coil to change the inductance which can constitute an analog value to be digitized for purposes of controlled movement. The signal from this differential transformer (LVDT) 36 is conditioned and digitized. The numbers indicate the position of the bond tool 20 relative to a stop which is considered a mechanical ground. This information is used to detect the work surface and also for feed back to control the transducer block 31 motion. This is important for smooth touch down of the tool 20 on the work surface 25 of an integrated or semiconductor circuit.

A bracket 40 is attached to block 11 that serves to hold LVDT coil 41 and coils 42 and 43 as shown in FIG. 5. In addition two mechanical stops are provided to restrict the up and down movement of the transducer block 31. The lower limit stop 45 as shown in FIG. 2 is mounted on bracket 40 and is adjustable. The upper limit stop screw 44 as shown in FIG. 5 is mounted on the magnet holder 35 and is also adjustable.

Attached to the transducer block 31 is a dog legged clamp arm 50 that pivots around a shaft 51 as shown in FIG. 4. The clamp arm 50 holds the wire clamp assembly which is comprised of a pair of spring loaded clamp jaws forming a clamp 21. The clamp or jaws 21 can move a wire 24 to be bonded forward for feeding the wire before the first bond is made, or backwardly to break the wire after a second bond is made. The wire 24 is fed through a feed tube 23 that is connected to a coil of the wire to be bonded. This movement is further developed in FIGS. 8 through 16.

The clamp arm 50 is spring loaded against a rotationally moving feed cam 54 installed on a small stepper motor 53. The stepper motor 53 is mounted on a bracket that is attached to block 13 by screws 134 and 136. A pair of sensors 55 and 164 verify the home position for the feed cam 54 and its direction as to whether it is in the feed region of the cam or wire break.

Looking at FIG. 3 as to the clamp 21, it is formed by two arms 26 and 27. A pivot 28 is formed with a bearing against which the arm 26 can articulate to cause the jaws 21 formed by arms 26 and 27 to open and close.

The stepper motor 53 has a shaft 160 on which the feed cam 54 is connected. The feed cam 54 also has a shutter 162 for purposes of opening and closing the optical sensor 55 and 164. The two respective optical sensors 55 and 164 allow a check of the direction as to the feed of the wire and the breaking of the wire through a wire clamp assembly 166 that hold the jaws 21. The optical sensors 55 and 164 check the hold position and feed it back to the onboard computer, which comprises a microprocessing unit (mpu) but also checks the direction of the feed and the direction of the break.

The shutter 162 as can be seen has a pair of insets 168 and 170. These insets 168 and 170 provide for the movement over the sensors 164 and 55 so that the positioning of the shutter 162 can be determined.

The cam 54 with the cam surface as mounted on the shaft 160 of the stepper motor engages a rotationally moving cam follower 178. The cam follower 178 is attached to a bracket 180 which is in turn attached to the dog legged clamp arm 50. The dog legged clamp arm 50 in its pivotal relationship around pivot point 51 is biased by means of a spring 184 connected to a bracket 186 at the other end so as to pull the cam follower 178 against the surface of the cam 54. A pin 190 is provided on the cam surface in order to provide for a stop so the cam will not be pushed beyond a particular position and thereby disengage and disorient the cam with respect to the stepper motor and the shutter 162.

Thus, it can be seen, the jaws 21 move upwardly and downwardly as driven by the stepper motor 53. This thereby causes the jaws 21 to move upwardly and downwardly as shown in FIG. 4. The movement in the direction of the arrow shows the motion to feed and break the wire.

The spring loaded jaws 21 comprising two aluminum arms, arm 26, arm 27 are actuated about their pivot by a cable. Specifically arm 27 pivots around the flex-pivot or bearing 28 and is attached to an arm 60 by a cable 61 which pulls the arm.

The arm 60 is spring loaded against a clamp opening cam 62 installed on the shaft of a stepper motor 63. The stepper motor 63 is mounted on a bracket 64 which is attached to the block 11. A home position sensor 65 in the form of an optical sensor verifies home position after each cycle. The stepper motor 63 is computer controlled and the desired clamp jaw 21 opening is programmable through the computer. The sensor 65 is mounted on a bracket 210 by means of screws as shown thereat.

The home position as established by the home sensor is accomplished by means of a shutter 200. The shutter 200 is attached to the shaft 202 of the stepper motor 63. This enables the shutter 200 to turn and effectuate an input to the sensor at the point of two notches 204 and 206 which are part of a shutter 200. In effect, by virtue of the shutter 200 turning on the stepper motor 63, and the sequential functions being input to the host or onboard computer, which will be described hereinafter, the movement of the stepper motor can be controlled.

In order to maintain the arm 60 in its spring biased position against the cam 62, a spring 212 is provided which engages the arm 60 for pivoting at point 228. This spring 212 causes the arm 60 to engage the cam 62 by means of a cam follower 224 which is connected to a bearing 226 that engages the cam and causes the arm 60 to be moved around its pivot 228 formed as a bearing. The pivot 228 of course allows for the articulated movement of the arm 60 in the direction of the arrow backwardly and forwardly as shown. This is accomplished by pulling the cable 61 thereby opening the jaws 21 in articulated opening and closing movement. This thereby creates an opening and closing of the jaws 21 as connected to the clamp arm bracket 50 so that the wire can be held and maneuvered as will be shown in FIGS. 8 through 16 hereinafter.

The cable 61 has been shown attached to the arm 60 by means of a nut 240 on a bolt 242 which connects the cable. However, any suitable means which will allow articulation of the jaws 21 can be utilized so that a direct drive can be utilized.

The jaws 21 are held in closed relationship by means of a spring 246 which again can be substituted by any spring biasing means in order to hold the jaws in particular the arms 26 and 27 in a closed relationship at their ends.

Figure 7:
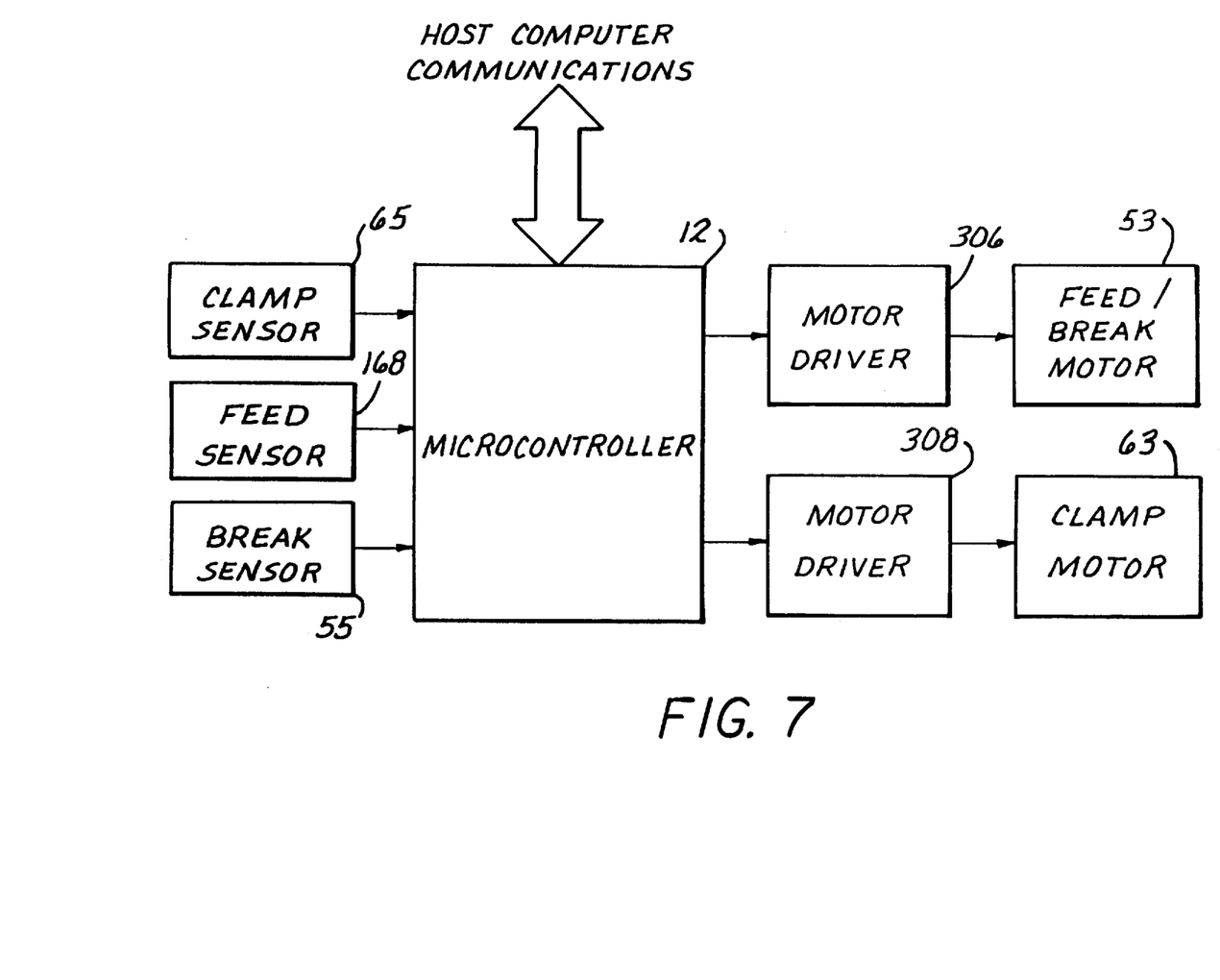
FIG. 7 shows a block diagram of the interface between the host computer and the onboard computer of the wire bonder.

Looking more particularly at FIG. 7 it can be seen where a host computer communicates to a microcontroller or microprocessing unit (mpu). The mpu is mounted on the bonding head and is shown as mpu board 300 having the microprocessor 12 therein. The board 300 incorporates conditioning circuitry and other electronic aspects including motor drivers in order to digitize and provide for the driving of the stepper motors as previously set forth. The mpu 12 is in the form of a microprocessor 68HC711D3, and provides for the various control functions of the motor drivers on the board and the movements to create the feeding and breaking of the wire 24 as well as the clamping of the wire.

The mpu 12 receives signals from the sensors as previously set forth. In particular, a sensor 65 is shown in the form of a clamp sensor in FIG. 7. This clamp sensor 65 is connected to the mpu in order to provide for the control of the clamp and jaws 21.

A feed sensor 168 and a break sensor 55 in the form of optical sensors provide for verification of the motor 53 position after the breaking and the feeding of the wire. This serves to maintain the positioning and control of the feeding and breaking of the wire 24 that is set forth hereinafter in FIGS. 8 through 16.

Mounted on the board 300 or elsewhere, can be the motor drivers respectively for the wire clamp opening and wire feed and break functions. In particular, a motor driver 306 is shown for driving the wire feed and break stepper motor 53. A motor driver 308 is utilized specifically for the clamp motor or stepper motor 63 that operates the jaws 21.

With the LVDT or position sensor 36, the positioning of the bond or bonding head with the bonder 20 and clamps 21 can be finitely resolved with the use of the host computer. As a consequence, the lowering and raising with regard to the sensing by the LVDT 36 or height positioning sensor 36 in the form of the LVDT functions in a manner such that appropriate pressure can be applied to the bonding tool 20. This is through the virtual pivot provided through the pivot points 108, 110, 114 and 116 as it moves the transducer block 31 upwardly and downwardly for proper positioning and pressure based upon the force against the spring bias provided by spring 34. The net result is to establish a bond head position through the sensor 36 utilizing the LVDT, and then maintaining that position and creating the bond in the manner as set forth hereinafter with respect to the operation of the stepper motors 53 and 63 respectively feeding and breaking the wire bond, and clamping the wire 24.

Figure 6:
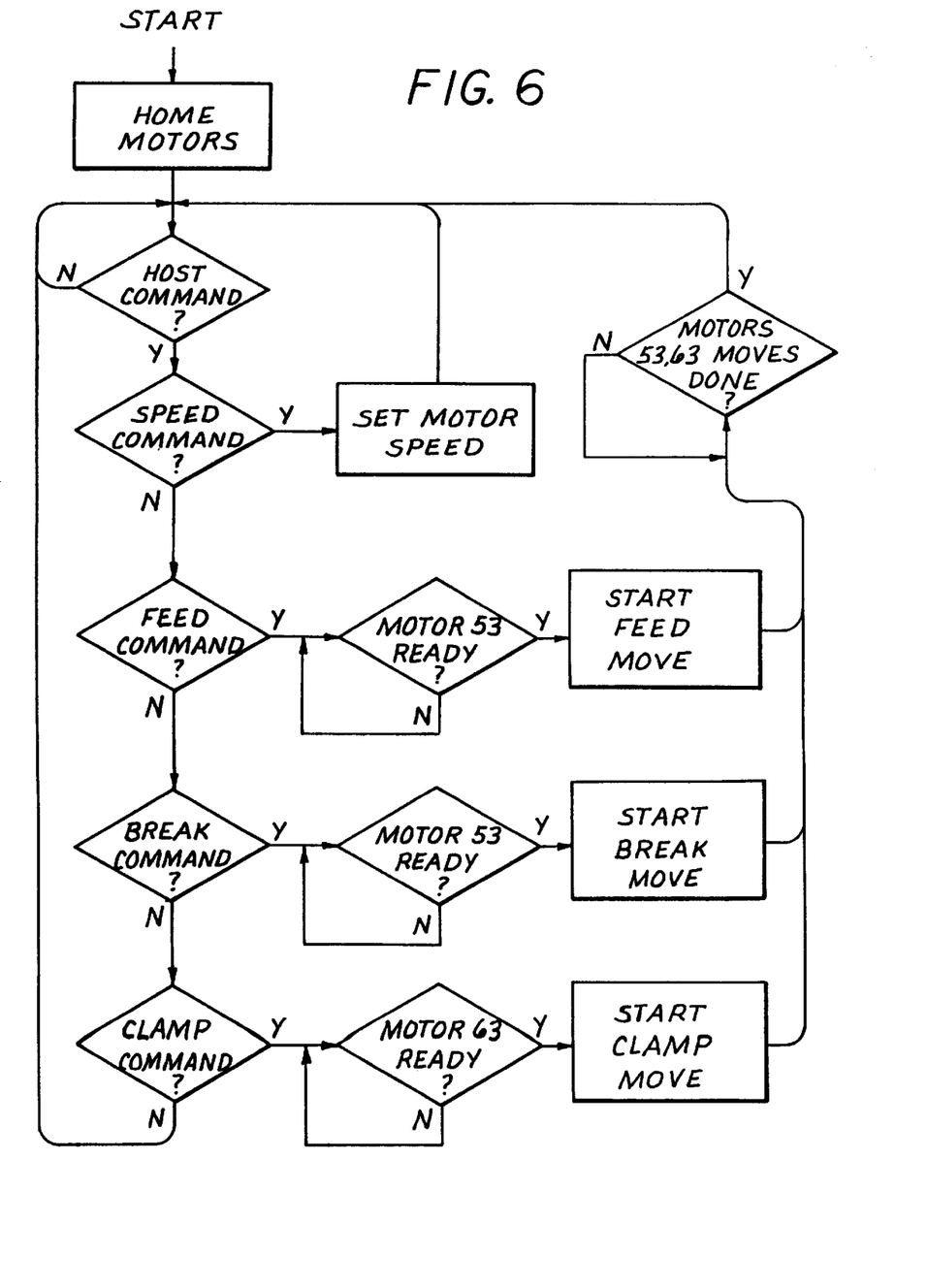
FIG. 6 shows a block diagram of the functional movements and commands for completing a wire bond.

Looking more particularly at FIG. 6, the interfacing of the stepper motors 53 and 63 with the respective host commands after the positioning of the bond head has taken place can be seen. The control of the speed of the motors 53 and 63, and the feed, break, and clamp functions with their respective feedback mechanisms for checking the movements via mpu 12 in response to host commands is shown.

SEQUENCE OF MOTION AS SHOWN IN FIGS. 8 THROUGH 16

Looking more particularly at FIGS. 8 through 16, a series of articulated movements are shown as to the bonding action and formation.

Figure 8:
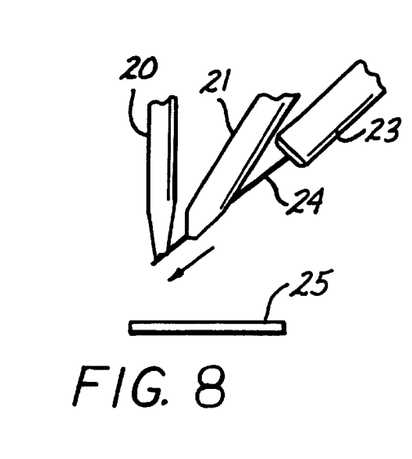
FIG. 8 shows the bond head of the bonder at its home position.

FIG. 8 shows the bonder with the tool 20 and clamp 21 at its home position. The wire 24 is being fed through the wire feeder 23 from a coil.

Figure 9:
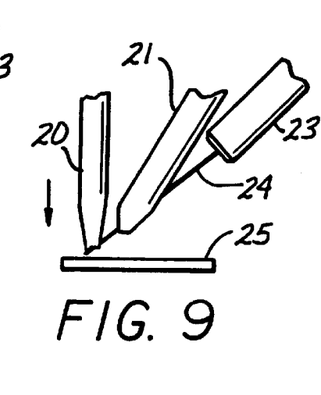
FIG. 9 shows the bonding head moving downwardly to the search height.

In FIG. 9 the bonding head 20 moves downwardly to a height called the search height. The wire 24 is fed by the wire clamp jaws 21. The search height is set at a certain height from the work 25. The work height is automatically taught during the teaching mode by the operator. Teaching mode is when a file is created for a certain application. The search height is normally 0.025 inches from the work 25 height.

Figure 10:
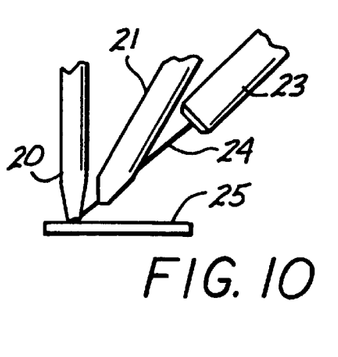
FIG. 10 shows the bonding tool touching the work ready for a bond.

In FIG. 10 the transducer holder block 31 has been lowered down until the bonding tool 20 touches the work 25. This move is generated by the linear motor 37 comprising coils 42 and 43, and magnets 71 and 72. This is computer controlled and has a resolution of one gram per bit. The surface of the work 25 is detected by the monitoring position sensor 36 formed by the LVDT. Once on the surface of the work 25, the linear motor 37 ramps up to a programmed force value needed to perform bonding by downward force in the Z axis.

Figure 11:
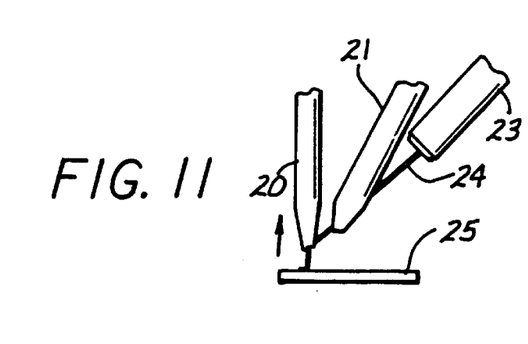
FIG. 11 shows the wire bonded to the surface with the wire bonding tool being lifted off the surface.

FIG. 11 shows the movement after bonding to the surface of the work 25. At this point the linear motor 37 lifts the transducer holder block 31 back up against the stop 44 as seen in FIG. 5.

Figure 12:
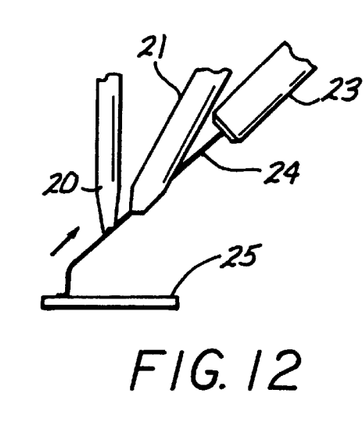
FIG. 12 shows the bond head moving upwardly to hold the wire and create a loop thereof.

In FIG. 12 the bond head is shown moving upwardly in the X, Y, and Z axes to the top of the loop to be formed of the wire 24. This height is dependent on the programmed step back value between two bonds of a given wire 24 and the programmed wire loop height.

Figures 13, 14:
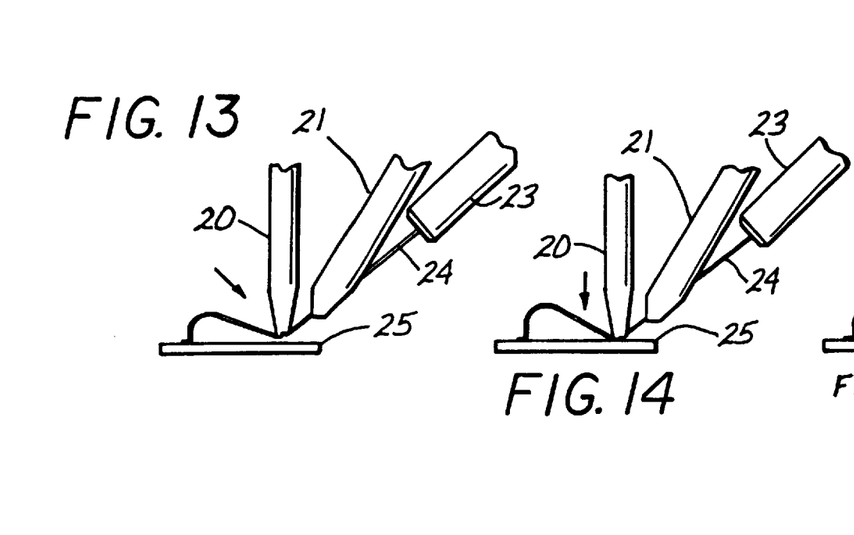
FIG. 13 shows the bonder moving downwardly to a second bond search height.
FIG. 14 shows a second bond.

FIG. 13 like FIG. 9 shows the bonder moving downwardly to the second bond search height.

FIG. 14 shows the same move as FIG. 10 for the second bond.

Figure 15:
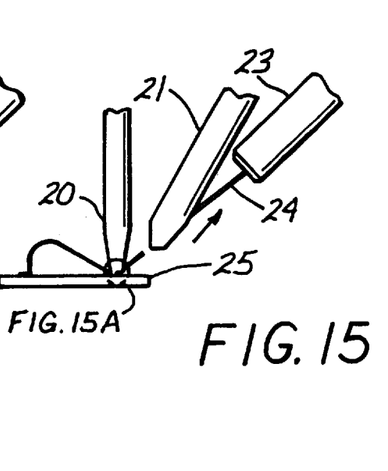
FIG. 15 shows a break in the wire after it has been bonded.

In FIG. 15 the feed motor 53 has moved the wire clamp assembly 166 with the clamp jaws 21 backwardly to break the wire. This is shown by the clamp jaws 21 still holding the wire 24 and causing it to break. This move is programmable.

Figure 15A:
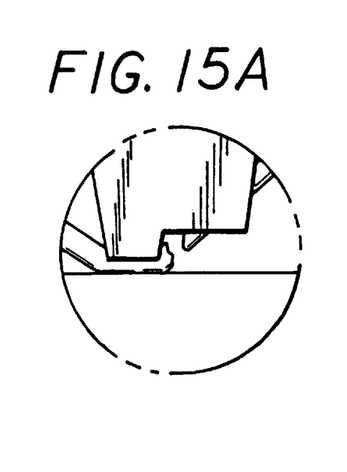
FIG. 15A show an enlarged view of the break in the wire of FIG. 15.

FIG. 15A shows a detail of the broken wire as shown in FIG. 15.

Figure 16:
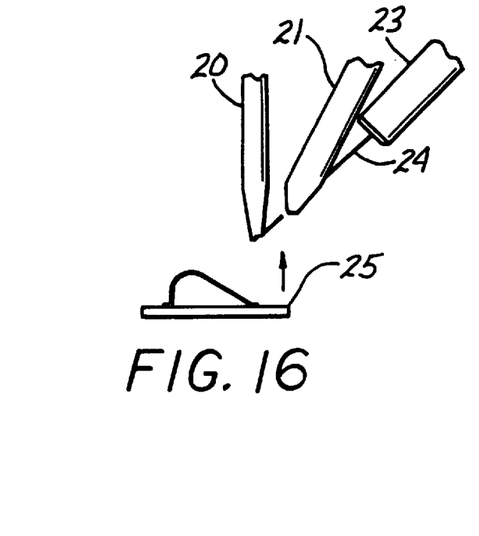
FIG. 16 shows the bond head moving upwardly for preparation of another bond.

FIG. 16 shows when the transducer holder block 31 is lifted up again, after the entire bond head moves backwardly up to home position to start another bond or move to another Z or Y axial position.

The foregoing specification sets forth the functions, methods and apparatus of the bonder of this invention which should be read broadly in light of the claims hereinafter.

I claim:

1. A wire bonding head supported for movement upwardly and downwardly on a member which can move in the Z axis of the bonding head comprising:

a wire bonding tool;

means for ultrasonically driving said wire bonding tool in order to ultrasonically bond a wire to an underlying surface;

means for impressing said bonding tool against a wire to be bonded;

means for feeding wire to said bonding tool;

means for clamping and holding the wire; and, a processing unit mounted on said bonding head for controlling said means for clamping the wire and feeding the wire.

2. The wire bonding head as claimed in claim 1 further comprising:

said means for clamping the wire in part comprises a stepper motor.

3. The wire bonding head as claimed in claim 1 further comprising:

said means for feeding the wire in part comprises a stepper motor.

4. The wire bonding head as claimed in claim 1 further comprising:

means for breaking the wire after a bond is made.

5. The wire bonding head as claimed in claim 4 wherein:

said means for breaking the wire and feeding the wire in part comprise a pair of arms forming jaws for holding the wire.

6. The wire bonding head as claimed in claim 5 wherein:

said jaws have at least one of said arms forming said jaws pivotally mounted for rotation about a point in adjacent relationship to the other of said arms of said jaws.

7. The wire bonding head as claimed in claim 6 further comprising:

a stepper motor; and, sensing means for determining the position of said stepper motor connected to said processing unit on said bonding head for opening and closing said jaws.

8. The wire bonding head as claimed in claim 7 wherein said sensing means comprises:

a shutter attached to said stepper motor; and, optical sensors for responding to the movement of said shutter in connected relationship to said processing unit.

9. The wire bonding head as claimed in claim 7 wherein:

said jaws are opened and closed by a cam attached to said stepper motor connected to a cam follower which is connected to said jaws for opening and closing said jaws.

10. The wire bonding head as claimed in claim 4 further comprising:

a stepper motor having a cam connected thereto and a cam follower for moving said means to feed and break the wire.

11. The wire bonding head as claimed in claim 10 further comprising:

a pivotal bracket connected to said cam follower and to said jaws for moving said jaws with the wire over work that the wire is to be bonded to.

12. The wire bonding head as claimed in claim 11 further comprising:

sensor means for determining movement of said stepper motor connected to said processing unit which is in turn connected to a host computer for controlling the bonding movement.

13. The bonding head as claimed in claim 12 wherein said sensor means comprise:

a shutter connected to said stepper motor; and, optical sensors for sensing movement of said shutter connected to said processing unit.

14. A wire bonding head supported for movement in a Z and rotational axis with respect to an underlying surface comprising:

a wire bonding tool for bonding wire to an underlying surface;

means for holding said wire bonding tool in relationship to a wire that is to be bonded;

means for feeding wire to said wire bonding tool and breaking the wire after a bond has been made;

a stepper motor connected to said means for feeding wire and breaking the wire; and, sensor means for sensing movement of said stepper motor comprising optical sensors in relationship to a shutter connected to said stepper motor.

15. The wire bonding head as claimed in claim 14 wherein said means for feeding wire and breaking wire comprises:

a pivotal link for movement by said stepper motor.

16. The wire bonding head as claimed in claim 15 wherein:

said pivotal link is connected to a cam follower; and, said cam follower is moved by a cam connected to said stepper motor.

17. The wire bonding head as claimed in claim 14 further comprising:

a processing unit attached to said bonding head for controlling said stepper motor.

18. The wire bonding head as claimed in claim 14 further comprising:

a processing unit connected to said stepper motor and said sensor means for controlling said stepper motor.

19. The method of bonding wire to an electronic component comprising:

providing a wire bonding head with a wire bonding tool;

providing a pair of arms forming jaws connected to said wire bonding head;

feeding wire held by said jaws;

ultrasonically bonding said wire to an underlying component;

moving said jaws by a stepper motor connected to said jaws;

controlling said stepper motor connected to said jaws by a processing unit; and moving said jaws, and opening and closing said laws by at least two stepper motors controlled by a processing unit.

20. The method as claimed in claim 19 further comprising:

making a second bond with said wire bonding tool;

breaking said wire by said jaws moving in response to said stepper motor.

21. A bonding head for bonding wire to an electronic component comprising:

a bonding tool;

means for sonically moving said bonding tool for bonding wire to said component;

means for clamping the wire in adjacent relationship to said bonding tool; and, a stepper motor connected to said clamping means for actuating said clamping means.

22. The wire bonding head as claimed in claim 21 further comprising:

means for actuating said clamping means including a cam connected to said stepper motor; and, a cam follower in connected relationship to said clamping means.

23. The wire bonding head as claimed in claim 22 further comprising:

means for sensing movement of said stepper motor; and, a processing unit connected to said means for sensing movement to control the movement of said stepper motor.

24. The wire bonding head as claimed in claim 23 wherein said means for sensing movement comprises:

a shutter connected to said stepper motor; and, an optical sensor in relationship to said shutter to provide sensing of the movement of said stepper motor.

25. The wire bonding head as claimed in claim 24 wherein said wire clamping means comprises:

two arms forming jaws; and, wherein one of said arms pivots to open and close said jaws.

26. A method for bonding wire ultrasonically including a bonding head that moves in a Z axis with respect to an underlying surface comprising:

providing a bonding tool connected to a source of ultrasonic energy for purposes of bonding a wire;

providing means for clamping wire, feeding wire, and breaking wire to be bonded; and, controlling said means for clamping, feeding, and breaking the wire with a processing unit on the bonding head.

27. The method as claimed in claim 26 further comprising:

moving said means for clamping, feeding, and breaking the wire by at least one stepper motor.

28. The method as claimed in claim 27 further comprising:

clamping the wire by means of a pair of jaws; and, moving said jaws by a cam connected to said at least one stepper motor and a cam follower in connected relationship to said jaws.

29. The method as claimed in claim 26 further comprising:

moving said means for feeding the wire and breaking the wire by pivoting said means by said at least one stepper motor.

30. The method as claimed in claim 26 further comprising:

a processing unit connected to said means for feeding and breaking said wire; and, controlling said means for feeding and breaking the wire by said processing unit.

\* \* \* \* \*